(12) United States Patent
Ray et al.

(10) Patent No.: US 9,570,291 B2
(45) Date of Patent: Feb. 14, 2017

(54) SEMICONDUCTOR SUBSTRATES AND METHODS FOR PROCESSING SEMICONDUCTOR SUBSTRATES

(71) Applicant: GLOBALFOUNDRIES, Inc., Grand Cayman (KY)

(72) Inventors: Shishir Ray, Clifton Park, NY (US); Sandeep Gaan, Clifton Park, NY (US); Sheldon Meyers, Clifton Park, NY (US); Nisha Pillai, Malta, NY (US); Edmund Kenneth Banghart, Pittsford, NY (US); Kyle Jung, Saratoga Springs, NY (US)

(73) Assignee: GLOBALFOUNDRIES, INC., Grand Cayman (KY)

( * ) Notice: Subject to any disclaimer, the term of this patent is extended or adjusted under 35 U.S.C. 154(b) by 0 days.

(21) Appl. No.: 14/798,796

(22) Filed: Jul. 14, 2015

(65) Prior Publication Data

US 2017/0018426 A1   Jan. 19, 2017

(51) Int. Cl.
*G03F 7/26* (2006.01)
*H01L 21/02* (2006.01)
*H01L 29/16* (2006.01)

(52) U.S. Cl.
CPC ..... *H01L 21/02356* (2013.01); *H01L 21/0234* (2013.01); *H01L 21/02118* (2013.01); *H01L 21/02345* (2013.01); *H01L 21/02592* (2013.01); *H01L 21/02675* (2013.01); *H01L 29/1604* (2013.01)

(58) Field of Classification Search
CPC ........... H01L 21/0234; H01L 32/02675; H01L 21/02592; H01L 29/1604; H01L 21/02348; H01L 21/0251; H01L 21/0274; H01L 21/0275; H01L 21/312; H01L 21/3105; H01L 21/32; H01L 21/47; G03F 7/26; G03F 7/0382; G03F 7/0392; G03F 7/265; G03F 7/2046
See application file for complete search history.

(56) References Cited

U.S. PATENT DOCUMENTS

| 3,997,964 | A |   | 12/1976 | Holbrook et al. |
|---|---|---|---|---|
| 5,064,748 | A | * | 11/1991 | Bobbio ................... G03F 7/091 216/87 |
| 5,930,658 | A | * | 7/1999 | Ibok .................. H01L 21/02164 257/E21.193 |
| 6,530,103 | B2 |   | 3/2003 | Pan et al. |
| 6,934,595 | B1 |   | 8/2005 | O'Brien |
| 8,232,204 | B1 | * | 7/2012 | Horak ............... H01L 21/76897 257/E21.585 |

(Continued)

*Primary Examiner* — Galina Yushina
(74) *Attorney, Agent, or Firm* — Lorenz & Kopf, LLP (57) ABSTRACT

Semiconductor substrates and methods for processing semiconductor substrates are provided. A method for processing a semiconductor substrate includes providing a semiconductor substrate having an outer edge, a central region, and a peripheral region between the outer edge and the central region. The semiconductor substrate also has an upper surface. The method includes forming an amorphous material over the upper surface of the semiconductor substrate in the peripheral region. Also, the method includes irradiating the upper surface of the semiconductor substrate, wherein the amorphous material inhibits cracking at the outer edge of the semiconductor substrate.

14 Claims, 4 Drawing Sheets

(56) References Cited

U.S. PATENT DOCUMENTS

| | | |
|---|---|---|
| 8,319,149 B2 | 11/2012 | Ma et al. |
| 8,834,155 B2 | 9/2014 | Li et al. |
| 8,846,532 B2 | 9/2014 | Feng et al. |
| 2004/0087095 A1* | 5/2004 | Handa ................ H01L 21/26513 438/302 |
| 2004/0169009 A1* | 9/2004 | Kitamura .................. G03F 7/36 216/67 |
| 2004/0213514 A1* | 10/2004 | Tanaka ................ G02B 27/0966 385/31 |
| 2009/0278259 A1* | 11/2009 | Kouno ............. H01L 21/76835 257/751 |
| 2012/0261828 A1* | 10/2012 | Bruce ................ H01L 23/5222 257/774 |
| 2013/0032949 A1* | 2/2013 | Lin .................... H01L 23/5222 257/774 |
| 2014/0356980 A1* | 12/2014 | Barash .................. H01L 22/12 438/5 |

* cited by examiner

SEMICONDUCTOR SUBSTRATES AND METHODS FOR PROCESSING SEMICONDUCTOR SUBSTRATES

TECHNICAL FIELD

The technical field generally relates to semiconductor substrates used in the fabrication of integrated circuits, and more particularly relates to semiconductor substrates and methods for fabricating integrated circuits on semiconductor substrates that avoid edge damage due to thermal processing.

BACKGROUND

The fabrication of integrated circuits involves subjecting a semiconductor substrate to numerous processes, such as photoresist coating, photolithographic exposure, photoresist development, etching, polishing, and heating or "thermal processing." In certain applications, thermal processing is performed to activate dopants in doped regions (e.g., source and drain regions) of the substrate. Thermal processing includes various heating (and cooling) techniques, such as rapid thermal annealing and laser thermal processing. Where a laser is used to perform thermal processing, the technique is sometimes called "laser thermal processing" or "laser annealing."

Laser thermal processing involves irradiating a substrate with a localized beam of intense radiation to bring the substrate surface from a relatively low temperature (e.g., 400° C.) to a relatively high temperature (e.g., 1,200° C.) quickly. The high temperature regime has a short duration so that the heat can dissipate into the substrate bulk quickly.

Laser thermal processing may be used to activate dopants in source/drain regions of transistors formed in a silicon wafer. The source/drain regions are typically formed by exposing areas of a silicon wafer to an electro-statically accelerated ion beam containing ions such as boron, phosphorous or arsenic ions, depending upon whether an N-type field effect transistor (NFET) or P-type field effect transistor (PFET) is to be formed. After implantation, the dopant atoms are largely interstitial, do not form part of the silicon crystal lattice, and are electrically inactive. Activation of these dopant atoms may be achieved by raising the substrate temperature high enough and for a period of time long enough for the crystal lattice to incorporate the impurity atoms. The optimum length of time depends on the maximum temperature. However, during the activation thermal cycle, the impurities tend to diffuse throughout the lattice causing the distribution to change from one approximating an ideal step profile achieved during implant to a profile having a shallow exponential fall-off after a long annealing cycle.

By employing higher annealing temperatures and shorter annealing times as are characteristic of laser thermal processing, it is possible to reduce dopant diffusion and retain the abrupt step-shaped dopant distribution achieved after the implant step. The continuous reduction in transistor feature sizes has lead to a process called laser spike annealing, which employs a $CO_2$ laser beam formed into a long, thin image that is raster scanned across the wafer. In a typical configuration, a 0.1 mm wide beam is scanned at 100 mm/s over the wafer surface to produce about a 1 millisecond dwell time for the annealing cycle. A typical maximum temperature during this annealing cycle might be about 1350° C. In the 1 millisecond duration necessary to bring the wafer surface up to the annealing temperature, only about 100-200 micrometers of material nearest the upper surface is heated. Consequently, the bulk of the 800 micrometer thick wafer serves to cool the irradiated surface almost as quickly as it was heated after the laser beam is focused elsewhere.

At the outer edge of the wafer, less wafer material is available to conduct heat away from the irradiated surface. As a result, uncontrolled stresses may be introduced near the substrate's outer edge. Uncontrolled stresses may result in catastrophic mechanical failure leading to substrate breakage.

Accordingly, it is desirable to provide semiconductor substrates that better withstands irradiation induced stress as compared to semiconductor substrates produced through conventional laser spike annealing techniques. In addition, it is desirable to provide methods for fabricating integrated circuits that minimize semiconductor substrate breakage or damage resulting from annealing stress. Furthermore, other desirable features and characteristics of the present embodiment will become apparent from the subsequent detailed description and the appended claims, taken in conjunction with the accompanying drawings and this background.

BRIEF SUMMARY

Semiconductor substrates and methods for fabricating integrated circuits are provided. In an exemplary embodiment, a method for fabricating an integrated circuit includes providing a semiconductor substrate having an outer edge, a central region, and a peripheral region between the outer edge and the central region. The semiconductor substrate also has an upper surface. The method includes forming an amorphous material over the upper surface of the semiconductor substrate in the peripheral region. Also, the method includes irradiating the upper surface of the semiconductor substrate, wherein the amorphous material inhibits cracking at the outer edge of the semiconductor substrate.

In another embodiment, a method for fabricating an integrated circuit includes providing a semiconductor substrate. The method implants dopant ions into the semiconductor substrate. Also, the method includes forming a silylated region of material over the semiconductor substrate. The method further irradiates the semiconductor substrate with a beam of radiation to activate the dopant ions. In the method, the silylated region of material blocks the beam of radiation from the semiconductor substrate underlying the silylated region of material.

A semiconductor substrate is provided in another embodiment. The semiconductor substrate includes a layer of semiconductor material including a central region and a peripheral region surrounding the central region. The semiconductor substrate further includes an annular region of stress-reducing material covering the peripheral region of the semiconductor substrate.

This summary is provided to introduce a selection of concepts in a simplified form that are further described below in the detailed description. This summary is not intended to identify key features or essential features of the claimed subject matter, nor is it intended to be used as an aid in determining the scope of the claimed subject matter.

BRIEF DESCRIPTION OF THE DRAWINGS

The present embodiments will hereinafter be described in conjunction with the following drawing figures, wherein like numerals denote like elements, and wherein:

FIGS. 2-8 illustrate portions of an integrated circuit and methods for its fabrication in accordance with exemplary embodiments, wherein

DETAILED DESCRIPTION

The following detailed description is merely exemplary in nature and is not intended to limit the various embodiments or the application and uses thereof. Furthermore, there is no intention to be bound by any theory presented in the preceding background or the following detailed description.

According to various embodiments described herein, semiconductor substrates and methods for fabricating integrated circuits on semiconductor substrates are provided. Embodiments herein minimize induced stress caused by high energy laser irradiation to the peripheral region and outer edge of a semiconductor substrate. For example, in embodiments herein, a thermal-shielding or stress-reducing material is formed over the peripheral region of the semiconductor substrate. The stress-reducing material may reduce the amount of heat absorbed by the peripheral region of the semiconductor substrate during thermal processing, such as during a laser spike anneal process. Further, the stress-reducing material may serve as a heat sink to absorb heat from the semiconductor substrate during thermal processing.

Figure 1:
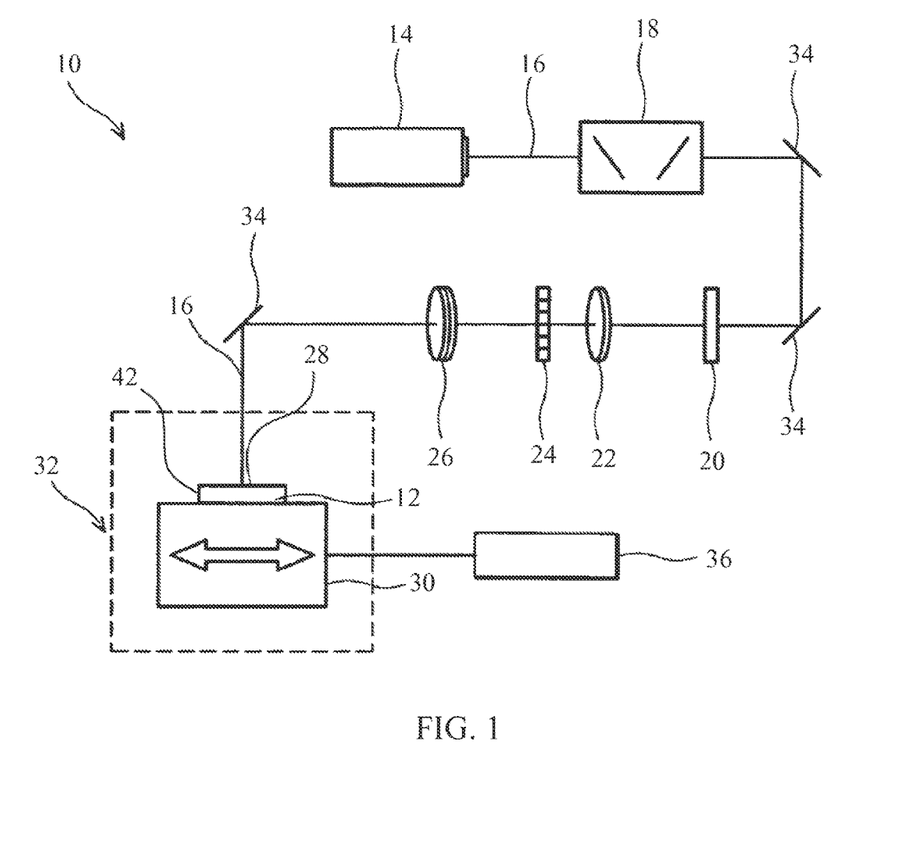
FIG. 1 illustrates an irradiation apparatus for use in processing a semiconductor substrate in accordance with exemplary embodiments.

FIG. 1 shows a laser thermal processing apparatus 10 for use in irradiation of a semiconductor substrate 12. As shown, the laser thermal processing apparatus 10 includes a laser source 14 adapted to irradiate a beam of radiation or laser beam 16. The laser thermal processing apparatus 10 further includes an attenuator 18, a homogenizer 20, and a field lens 22. The laser thermal processing apparatus 10 directs the laser beam 16 through the attenuator 18, homogenizer 20, and field lens 22 to control the energy of the laser beam 16 and to condense the laser beam 16. The laser thermal processing apparatus 10 includes a mask 24 through which the laser beam 16 is patterned with a predetermined shape. The laser thermal processing apparatus 10 includes an object lens 26 for further focusing of the patterned laser beam 16.

After the laser beam 16 has passed through the object lens 26, the laser beam 16 irradiates an upper surface 28 of the semiconductor substrate 12. As shown, the semiconductor substrate 12 is positioned on a movable stage 30, such as an x-y stage, inside a process chamber 32. The laser thermal processing apparatus 10 includes mirrors 34 that are provided for controlling the target of the laser beam 16. The relative motion of the laser beam 16 and the substrate 12 via movable stage 30 is controlled by a controller 36 to irradiate the upper surface 28 of the semiconductor substrate 12 with the laser beam 16 along a selected path.

The selected path typically travels over the upper surface 28 of the semiconductor substrate 12 to or past the outer edge 42 of the semiconductor substrate 12. As described in relation to FIGS. 2-8, embodiments herein inhibit damage to the semiconductor substrate 12 at the outer edge 42 due to irradiation induced stress.

Figure 2:
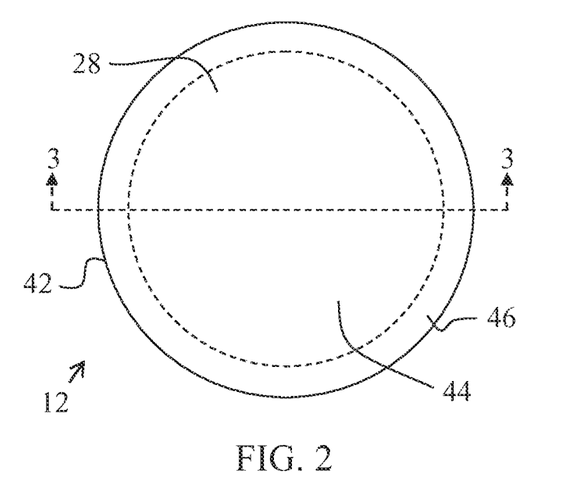
FIG. 2 is an overhead view of the semiconductor substrate of FIG. 1, FIGS. 3-7 are cross sectional view of the semiconductor substrate taken along line 3-3 in FIG. 2.
Figure 3:
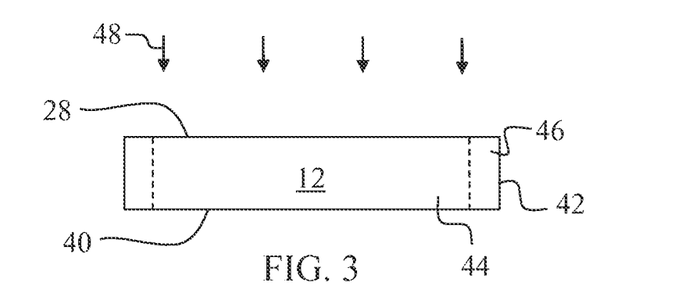

FIGS. 2-8 illustrate portions of a semiconductor substrate 12 and methods for fabricating an integrated circuits thereon in accordance with exemplary embodiments. FIG. 2 is an overhead view of an exemplary semiconductor substrate 12 and FIG. 3 is a cross sectional view of the semiconductor substrate 12 taken along line 3-3 in FIG. 2.

As used herein, the term "semiconductor substrate" encompasses semiconductor materials conventionally used in the semiconductor industry from which to make electrical devices. Semiconductor materials include monocrystalline silicon materials, such as the relatively pure or lightly impurity-doped monocrystalline silicon materials typically used in the semiconductor industry, as well as polycrystalline silicon materials, and silicon admixed with other elements such as germanium, carbon, and the like. In addition, "semiconductor material" encompasses other materials such as relatively pure and impurity-doped germanium, gallium arsenide, zinc oxide, glass, and the like. In an exemplary embodiment, the semiconductor material is a silicon substrate, such as crystalline silicon. The silicon substrate may be a bulk silicon wafer or may be a thin layer of silicon (on an insulating layer commonly known as silicon-on-insulator or SOI) that, in turn, is supported by a carrier wafer. As referred to herein, a material that includes a recited element/compound includes the recited element/compound in an amount of at least 10 weight percent based on the total weight of the material unless otherwise indicated.

As shown in FIGS. 2 and 3, the semiconductor substrate 12 includes an upper surface 28, a lower surface 40 and an outer edge 42. The semiconductor substrate 12 may have a substantially circular cross section and surfaces 28 and 40 may be substantially planar and parallel such that outer edge 42 is cylindrical.

In FIGS. 2 and 3, a central region 44 and a peripheral region 46 of the semiconductor substrate 12 are identified. As shown, the peripheral region 46 is positioned between the central region 44 and the outer edge 42 of the semiconductor substrate 12. The exemplary peripheral region 46 is annular and completely surrounds the central region 44. An exemplary peripheral region 46 has a radial width of from about 1 mm to 4 mm, such as about 2 mm. An exemplary central region 44 has a radius of from about 10 mm to about 20 mm.

As shown in FIG. 3, dopant ions 48 may be implanted into the semiconductor substrate 12. For example, n-type dopant ions and/or p-type dopant ions may be selectively implanted into the semiconductor substrate 12, depending upon whether NFETs or PFETs are to be produced as in conventional integrated circuit fabrication processing. For example, implant blocking masks may be formed and patterned and implant processes may be performed to selectively form desired implanted areas.

Figure 4:
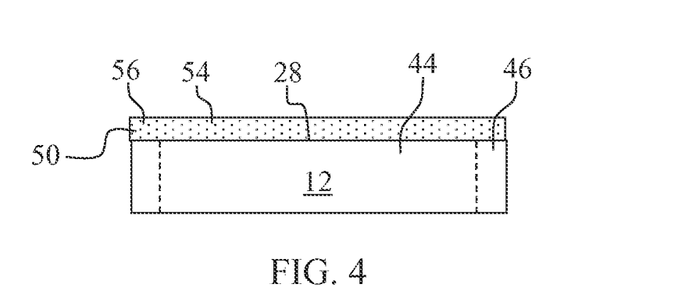

FIGS. 4-7 illustrate further processing of the semiconductor substrate 12 and are cross section views of the semiconductor substrate 12 similar to FIG. 3. In FIG. 4, a material layer 50 is formed overlying the semiconductor substrate 12. As used herein, the term "overlying" means "over" such that an intervening layer may lie between the material layer 50 and the semiconductor substrate 12, and "on" such that the material layer 50 physically contacts the semiconductor substrate 12. In the embodiment of FIG. 4, the material layer 50 is formed on the upper surface 28 of the semiconductor substrate 12. In an exemplary embodiment, the material layer 50 is a photoresist layer or film.

A central portion 54 of the photoresist layer 50 lies over the central region 44 of the substrate 12 and a peripheral portion 56 of the photoresist layer 50 lies over the peripheral region 46 of the substrate 12. In an exemplary embodiment, the photoresist layer 50 is deposited by spin-coating. An exemplary photoresist layer 50 has a thickness of from about 5000 Å to about 12000 Å. An exemplary photoresist layer 50 contains a photoresist resin, a photoacid generator, an organic solvent, and an amphoteric compound.

The photoresist resin may be a polymer and may be any chemically amplified photoresist resin known to one of ordinary skill in the art. A suitable photoresist resin is a chemically amplified photoresist resin that can be used in a top-surface imaging process by silylation. An exemplary photoresist resin is a photoresist polymer including a hydroxyl group.

Any suitable photoacid generator known to one skilled in the art can be used in the photoresist layer 50. An exemplary photoacid generator is diphenyl iodide hexafluorophosphate, diphenyl iodide hexafluoroarsenate, diphenyl iodide hexafluoroantimonate, diphenyl p-methoxyphenyl triflate, diphenyl p-toluenyl triflate, diphenyl p-isobutylphenyl triflate, diphenyl p-tert-butylphenyl triflate, triphenylsulfonium hexafluororphosphate, triphenylsulfonium hexafluoroarsenate, triphenylsulfonium hexafluoroantimonate, triphenylsulfonium triflate or dibutylnaphthylsulfonium triflate.

Any suitable organic solvent may be used in photoresist layer 50. Exemplary organic solvents include methyl 3-methoxypropionate, ethyl 3-ethoxypropionate, propylene glycol methyl ether acetate and cyclohexanone.

The amphoteric compound, i.e., a compound including an acidic group and a basic group, may include an amino group and a carboxylic acid group. The amphoteric compound may be an amino acid. An exemplary amphoteric compound is selected from glycine, alanine, valine, leucine, isoleucine, methionine, proline, phenylalanine, tryptophan, serine, threonine, cysteine, tyrosine, asparagine, and glutamine.

The photoresist layer 50 may be positive or negative. For a positive photoresist layer 50, the portion of the photoresist layer 50 that is exposed to light becomes activated, as described below in relation to FIGS. 5-7. For embodiments utilizing a negative photoresist layer 50 (not shown), the portion of the photoresist layer 50 that is exposed to light becomes de-activated.

Figure 5:
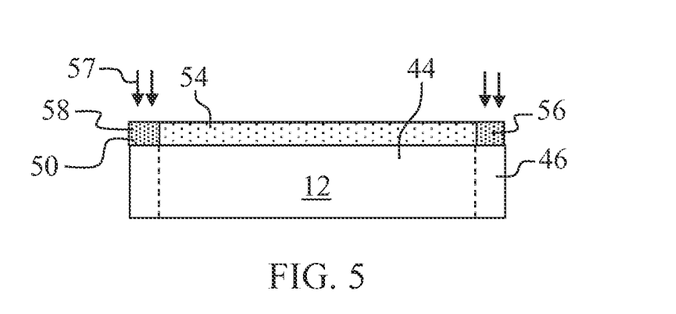

In an embodiment and as shown in FIG. 5, a photoresist exposure process is performed to selectively expose the portion 56 of the photoresist layer 50 overlying the peripheral region 46 of the substrate 12. For example, patterned radiation 57, such as patterned ultraviolet light or a patterned e-beam radiation, selectively irradiates portion 56 of the photoresist layer 50. The patterned radiation 57 may be directed to the portion 56 of the photoresist layer 50 by illuminating a mask with an e-beam or light source and imaging the mask onto the photoresist layer 50. This exposure polymerizes the portion 56. As a result, an exposed or activated portion 58 of the photoresist layer 50 is formed over the peripheral region 46 of the substrate 12 while the central portion 54 remains unexposed. Exemplary light sources which are useful for forming the photoresist pattern include g-line, i-line, argon fluoride (ArF) laser, krypton fluoride (KrF) laser, vacuum ultraviolet (VUV), extreme ultraviolet (EUV), electron beam (E-beam) laser, X-ray and ion beam. An exemplary irradiation energy is from about 0.1 to about 10 mJ/cm$^2$. The exposure process may include baking the semiconductor substrate 12 before or after selectively exposing a portion of the photoresist layer 50. An exemplary baking step is performed at from about 70° C. to about 200° C. to evaporate solvent from the photoresist layer 50.

Figure 6:
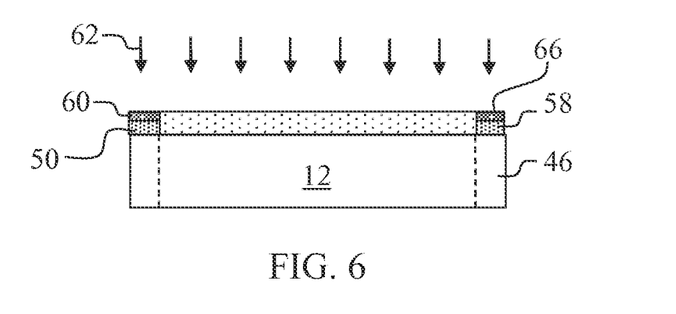

In an embodiment and as shown in FIG. 6, a stress-reducing layer 60 is formed over the peripheral region 46 of the semiconductor substrate 12. In an exemplary embodiment, the stress-reducing layer 60 is formed of amorphous material, such as amorphous silicon. For example, a silylation process may be performed by contacting the photoresist layer 50 with a silylation agent 62. Specifically, the surface 66 of the exposed portion 58 of the photoresist layer 50 is contacted with the silylation agent 62 under conditions sufficient to produce silylated material that forms the stress-reducing layer 60 or silylated layer 60. For example, the silylation agent 62 may be hexamethyldisilazane [HMDS: $(CH_3)_3Si-NH-Si(CH_3)_3$], tetramethyldisilazane [TMDS: $((CH_3)_2SiH)_2NH$], bis(dimethylamino)methyl silane [B(DMA)MS: $((CH_3)_2N)_2Si(CH_3)_2$], or another organo-metallic compound containing silicon, and may be contacted with the surface 66 of the exposed portion 58 of the photoresist layer 50. The silylation agent 62 may be employed in a liquid phase or a gas phase. Alternatively, the silylation agent 62 may be silicon plasma.

In the illustrated embodiment, the central portion 54 of the photoresist layer 50 is non-activated and does not react with the silylation agent 62. Therefore, the central portion 54 defines a non-silylated portion of the photoresist layer 50. The activated portion 58 of the photoresist layer 50 is silylated as a result of contact with the silylation agent 62.

In the silylation process, it is believed that the silylation agent 62 diffuses and penetrates into the activated photoresist resin. The hydroxyl group present in the photoresist resin reacts with the silylating agent to form a silicon-oxygen bond. As a result, a silylated layer 60 is formed as a silicon rich polymer. During silylation, silicon of the silylation agent bonds to the UV exposed resist polymer molecule by replacing its hydrogen.

After contact between the silylation agent 62 and the activated region 58 of the photoresist layer 50, a thermal treatment may be performed to densify the silylated layer 60. The thermal treatment may be performed at a temperature of from about 100° C. to about 250° C., such as from about 150° C. to about 200° C.

Figure 7:
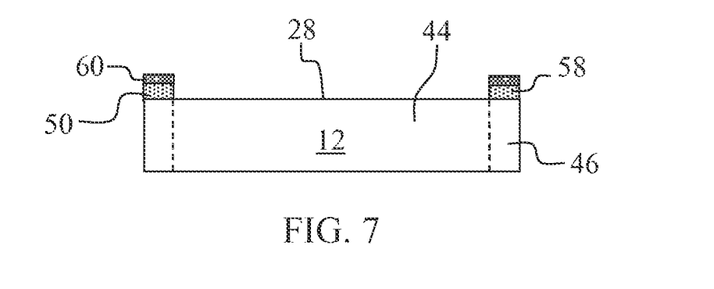

In an embodiment and as shown in FIG. 7, the non-silylated central portion 54 of the photoresist layer 50 is removed. For example, the non-silylated central portion 54 may be selectively etched, such as by a $O_2$ plasma etch process. During such an etch process, non-silylated photoresist is easily removed by the $O_2$ plasma whereas the silylated region is protected by the silicon rich layer. As a result, the upper surface 28 of the semiconductor substrate 12 in the central region 44 is exposed while the upper surface 28 of the semiconductor substrate 12 in the peripheral region 46 is covered by the silylated layer 60. As shown, a portion of the non-silylated photoresist layer 50 may remain underlying the silylated layer 60. Alternatively, the entire portion of the photoresist layer 50 overlying the peripheral region 46 of the semiconductor substrate 12 may be activated and converted to the silylated layer 60 such that no non-silylated portion of photoresist remains after the removal of the non-silylated central portion 54 of the photoresist layer 50 in FIG. 7.

Figure 8:
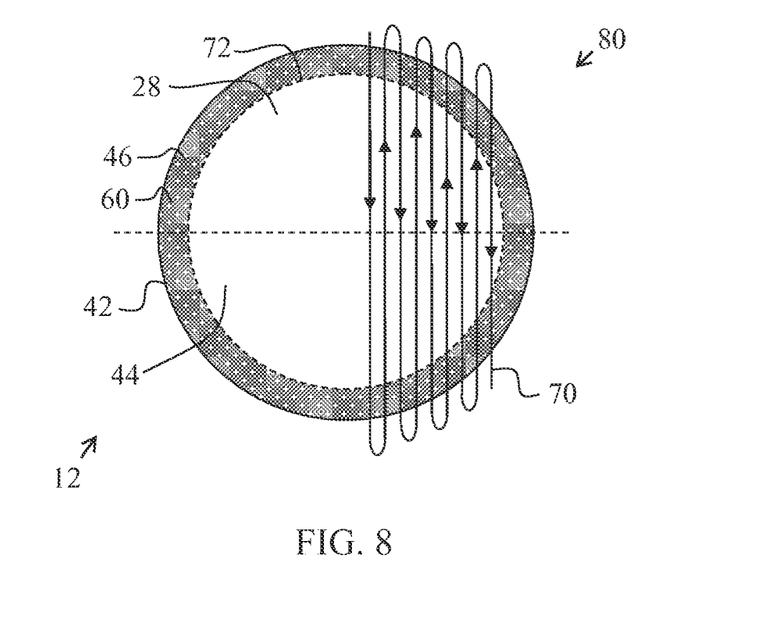
FIG. 8 is an overhead view of the semiconductor substrate of FIG. 7.

FIG. 8 provides an overhead view of the semiconductor substrate 12 of FIG. 7, similar to the view of FIG. 2. In an embodiment and as shown, the silylated layer 60 covers the peripheral region 46 and forms an annular region surrounding the central region 44 of the semiconductor substrate 12 where the upper surface 28 is exposed. FIG. 8 illustrates an irradiation process in which the upper surface 28 of the central region 44 of the semiconductor substrate 12 is irradiated by a beam of radiation. For example, the laser thermal processing apparatus 10 of FIG. 1 may direct the laser beam 16 to irradiate the upper surface 28 of the semiconductor substrate 12 along a selected path indicated by arrows 70. (Arrows 70 indicate only a portion of a path over the semiconductor substrate for purposes of economy and clarity.) As shown, the path 70 of the beam of radiation passes the interface 72 between the central region 44 and the peripheral region 46. Further, the path 70 of the beam of radiation extends across the outer edge 42 of the semiconductor substrate 12. Despite the path of the beam of radiation over the peripheral region 46 and outer edge 42 of the semiconductor substrate 12, thermal induced damage to the peripheral region 46 and outer edge 42 of the semiconductor substrate 12 is minimized due to the presence of the stress-reducing layer 60.

The irradiation process performed along path 70 may be a laser thermal process, such as a laser spike anneal process, in which dopants are activated within the central region 44 of the semiconductor substrate 12, such as during typical processing of a partially fabricated integrated circuit 80. During the laser thermal process, the upper surface 28 of the peripheral region 46 of the semiconductor substrate 12 is shielded by the stress-reducing layer 60. As a result, the peripheral region 46 of the semiconductor substrate 12 experiences less heating and less thermally-induced stress than a peripheral region that is directly exposed to the irradiation beam.

In embodiments, during further processing to fabricate an integrated circuit 80 on the semiconductor substrate 12 the stress-reducing layer 60 need not be removed. Therefore, the inclusion of the stress-reducing layer 60 in the integrated circuit fabrication process does not necessitate additional masking or etching processes. Further, through the use of photoresist and the silylation of photoresist to form the silylated layer as the stress-reducing layer 60, the process described herein does not necessitate the use of additional masks as compared to conventional processing.

The semiconductor substrates and methods for fabricating integrated circuits on semiconductor substrates described herein inhibit cracking or other damage at the peripheral region or outer edge of the semiconductor substrate. Embodiments provide a stress-reducing layer over the peripheral region and aligned with the outer edge of the semiconductor substrate. The stress-reducing layer may prevent direct irradiation of the surface of the semiconductor substrate in the peripheral region and the subsequent heating of the peripheral region of the semiconductor substrate. Further, the stress-reducing layer may absorb heat from the semiconductor substrate to lessen thermal stress therein.

While at least one exemplary embodiment has been presented in the foregoing detailed description, it should be appreciated that a vast number of variations exist. It should also be appreciated that the exemplary embodiments are only examples, and are not intended to limit the scope, applicability, or configuration of the application in any way. Rather, the foregoing detailed description will provide those skilled in the art with a convenient road map for implementing one or more embodiments, it being understood that various changes may be made in the function and arrangement of elements described in an exemplary embodiment without departing from the scope, as set forth in the appended claims.

What is claimed is:

1. A method for processing a semiconductor substrate, the method comprising:
providing the semiconductor substrate having an outer edge, a central region, and a peripheral region between the outer edge and the central region, wherein the semiconductor substrate has an upper surface;
forming an amorphous material directly on the upper surface of the semiconductor substrate in the peripheral region;
irradiating the upper surface of the semiconductor substrate; and
inhibiting cracking at the outer edge of the semiconductor substrate with the amorphous material.

2. The method of claim 1 wherein providing the semiconductor substrate comprises providing the semiconductor substrate with the upper surface formed entirely by a semiconductor material, wherein forming the amorphous material directly on the upper surface of the semiconductor substrate in the peripheral region comprises forming the amorphous material only on the semiconductor material.

3. The method of claim 2 further comprising implanting dopant ions into the upper surface of the semiconductor substrate including into the central region and peripheral region of the semiconductor substrate before forming the amorphous material directly on the upper surface.

4. The method of claim 1 wherein forming the amorphous material directly on the upper surface of the semiconductor substrate in the peripheral region comprises:
forming a material layer on the upper surface of the semiconductor substrate, wherein the material layer is formed only on a semiconductor material of the semiconductor substrate; and
converting the material layer over the peripheral region of the semiconductor substrate to the amorphous material.

5. The method of claim 1 wherein forming the amorphous material directly on the upper surface of the semiconductor substrate in the peripheral region comprises:
forming a material layer directly on the upper surface of the semiconductor substrate; and
silylating the material layer over the peripheral region of the semiconductor substrate to form amorphous silicon, wherein the amorphous silicon is the amorphous material.

6. The method of claim 1 wherein irradiating the upper surface of the semiconductor substrate comprises directing a laser beam sequentially over the outer edge, the peripheral region, the central region, the peripheral region, and the outer edge.

7. The method of claim 1 wherein irradiating the upper surface of the semiconductor substrate comprises directing a laser beam in a linear path sequentially over the outer edge, the peripheral region, the central region, the peripheral region, and the outer edge.

8. The method of claim 1 wherein irradiating the upper surface of the semiconductor substrate comprises directing a laser beam along a plurality of linear path portions, wherein within each linear path portion the laser beam is directed sequentially over the outer edge, the peripheral region, the central region, the peripheral region, and the outer edge.

9. The method of claim 1 wherein irradiating the upper surface of the semiconductor substrate comprises heating the upper surface, and wherein the method further comprises absorbing heat from the upper surface into the amorphous material.

10. The method of claim 1 wherein irradiating the upper surface of the semiconductor substrate comprises heating the upper surface, and wherein the method further comprises absorbing heat from the upper surface directly into the amorphous material.

11. The method of claim 1 wherein the central region and the peripheral region meet along the upper surface at a surface interface, and wherein irradiating the upper surface of the semiconductor substrate comprises heating the upper surface, and wherein the method further comprises absorbing heat from the surface interface directly into the amorphous material.

12. The method of claim 1 wherein providing the semiconductor substrate comprises providing a bulk semiconductor material bounded by the outer edge, the upper surface, and a lower surface.

13. A method for processing a semiconductor substrate, the method comprising:
provi­ding the semiconductor substrate, wherein the semiconductor substrate includes an upper surface having a central region formed from a semiconductor material, an outer edge, a peripheral region between the central region and the outer edge and formed from the semiconductor material, and an interface where the central region contacts the peripheral region;
implanting dopant ions into the central region and the peripheral region of the upper surface of the semiconductor substrate;
forming a stress-reducing layer on the peripheral region of the upper surface of the semiconductor substrate, wherein the stress-reducing layer extends from the interface to the outer edge;
irradiating the central region of the upper surface of the semiconductor substrate with a beam of radiation; and
absorbing heat from the central region of the upper surface of the semiconductor substrate at the interface into the stress-reducing layer.

14. A method for processing a semiconductor substrate, the method comprising:
providing the semiconductor substrate having an outer edge, a central region, and a peripheral region between the outer edge and the central region, wherein the semiconductor substrate has an upper surface;
forming an amorphous material over the upper surface of the semiconductor substrate in the peripheral region;
irradiating the upper surface of the semiconductor substrate, wherein irradiating the upper surface of the semiconductor substrate comprises heating the upper surface;
absorbing heat from the upper surface directly into the amorphous material; and
inhibiting cracking at the outer edge of the semiconductor substrate with the amorphous material.

* * * * *